United States Patent [19]

Fukushima et al.

[11] Patent Number: 4,721,914
[45] Date of Patent: Jan. 26, 1988

[54] APPARATUS FOR UNILATERAL GENERATION OF A HOMOGENEOUS MAGNETIC FIELD

[75] Inventors: Eiichi Fukushima, Los Alamos, N. Mex.; Alan R. Rath, San Diego; Stephen B. W. Roeder, La Mesa, both of Calif.

[73] Assignee: The United States of America as represented by the United States Department of Energy, Washington, D.C.

[21] Appl. No.: 605,950

[22] Filed: May 1, 1984

[51] Int. Cl.$^4$ ............................................. G01R 33/20
[52] U.S. Cl. .................................... 324/320; 335/213; 128/653
[58] Field of Search ............... 324/300, 307, 309, 318, 324/319, 320, 322, 327–329; 128/653; 335/300, 213; 336/60

[56] References Cited

U.S. PATENT DOCUMENTS

| | | | |
|---|---|---|---|
| 2,856,579 | 10/1958 | Packard | 324/318 |
| 3,488,561 | 1/1970 | Anderson | 324/320 |
| 3,582,779 | 6/1971 | Bloom | 324/320 |
| 3,759,247 | 9/1973 | Doll et al. | 128/653 |
| 4,276,529 | 6/1981 | Heinzerling | 335/300 |
| 4,379,262 | 4/1983 | Young | 324/309 |
| 4,398,150 | 8/1983 | Barjhoux | 324/318 |

OTHER PUBLICATIONS

S. Mine et al, Highly Homogeneous Superconducting Magnet for Photocathode Pattern Transfer System, IEEE Trans. Magnetics, Mag 17 (#5), 1981, pp. 1986–1989.

K. Kaminishi et al, Practical Method of Improving the Uniformity of Magnetic Fields Generated by Single and Double Helmholtz Coils, Rev. Sci. Instrum., 52(3), Mar. 1981, pp. 447–453.

Primary Examiner—Michael J. Tokar
Attorney, Agent, or Firm—William A. Eklund; Paul D. Gaetjens; Judson R. Hightower

[57] ABSTRACT

An apparatus for unilaterally producing a substantially homogeneous magnetic field. The apparatus includes two circular electromagnet coils, a small coil and a large coil, which are coaxial with one another and which are separated by a distance equal to one-half the difference in the radius of the two coils. By appropriate selection of electrical currents, which are passed through the coil in opposite directions, a region of homogeneous magnetic field is formed. This region is centered on the common axis of the two coils, at a point on the axis which is at a distance from the small coil equal to one-half the radius of the small coil, and which is on the opposite side of the small coil from the large coil. The apparatus has particular application in the field of diagnostic medical NMR and other NMR applications.

11 Claims, 6 Drawing Figures

APPARATUS FOR UNILATERAL GENERATION OF A HOMOGENEOUS MAGNETIC FIELD

BACKGROUND OF THE INVENTION

The present invention is generally related to electromagnets. More particularly, this invention is related to electromagnets of the type used in nuclear magnetic resonance spectroscopy (NMR). This invention is the result of a contract with the Department of Energy (Contract No. W-7405-ENG-36).

There are many applications in which it is desirable to generate a magnetic field that is highly homogeneous; that is, one which has a substantially uniform field strength throughout some specified volume. Some examples of such applications are mass spectrometers, vibrating sample magnetometers, and various electron-gun systems such as electron-beam circuit etching devices. However, an application for which the requirement of magnetic field homogeneity is particularly critical is nuclear magnetic resonance spectroscopy (NMR).

There are generally two types of electromagnets used in NMR. The traditional NMR system employs a metal-core electromagnet having two pole pieces which are coaxial with one another and spaced apart from one another. The sample and the radio frequency (rf) coil are positioned between the metal pole pieces of the electromagnets. By using electromagnets and pole pieces which are large in diameter in comparison with the size of the sample and the rf coil, and by separating the pole pieces by the minimum distance necessary to provide sufficient space for the sample and rf coil, a relatively uniform magnetic field can be generated in the space between the pole pieces.

Newer high-resolution NMR systems use a single, cylindrically shaped solenoidal electromagnet, which is cooled with liquid helium to obtain superconductivity. The sample and the rf coil are inserted into the central region of the bore of the electromagnet, where the magnetic field is most uniform. For various reasons relating to the resolution and sensitivity of the system, the superconducting solenoidal electromagnets are presently most preferred for NMR studies.

The advent of the use of NMR for in vivo medical diagnostic studies has led to the development of progressively larger NMR systems. In the largest of such systems, the bore of the superconducting electromagnet is made sufficiently large to accommodate an individual in entirety. However, these developments have led to the recognition of certain disadvantages associated with this approach, primarily the high cost of such large supercooled electromagnets, the somewhat difficult access to the region of uniform field, and the anxiety experienced by some individuals upon being placed in the confined space of the electromagnet bore.

SUMMARY OF THE INVENTION

Accordingly, it is the object and purpose of the present invention to provide an apparatus that is capable of generating a substantially homogeneous magnetic field at a location removed to one side of the apparatus.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims. To achieve the foregoing and other objects, and in accordance with the purposes of the present invention, as embodied and broadly described herein, the apparatus of this invention comprises a small electromagnet coil and a large electromagnet coil. Each coil is substantially circular and defines a geometric plane in which the coil may be said to lie. The coils are coaxial with one another and are oriented so as to be parallel to one another. The coils are spaced apart by a distance d, which is measured from the planes of the coils and which is substantially equal to the quantity $(R_2 - R_1)/2$, where $R_2$ is the radius of the large coil and $R_1$ is the radius of the small coil. Electrical currents are applied in opposite directions in the coils, with the currents and the number of windings in the coils being selected such that the condition $N_1 I_1 / R_1^2 = N_2 I_2 / R_2^2$ exists substantially, where $N_1$ and $N_2$ are the number of turns in the small and large coils respectively, and $I_1$ and $I_2$ are the currents in the small and large coils respectively.

The present invention is operable, in principle, for both static and time-varying magnetic fields. Thus, a spacially uniform, time-varying magnetic field could be produced by varying the currents in the two coils in the appropriate manner. In principle this could be extended to audio or even radio frequencies.

BRIEF DESCRIPTION OF THE DRAWINGS

The accompanying drawings, which are incorporated in and form a part of the specification, illustrate the preferred embodiment of the present invention and, together with the description, serve to explain the principles of the invention. In the drawings.

DETAILED DESCRIPTION OF THE DRAWINGS

Figure 1:
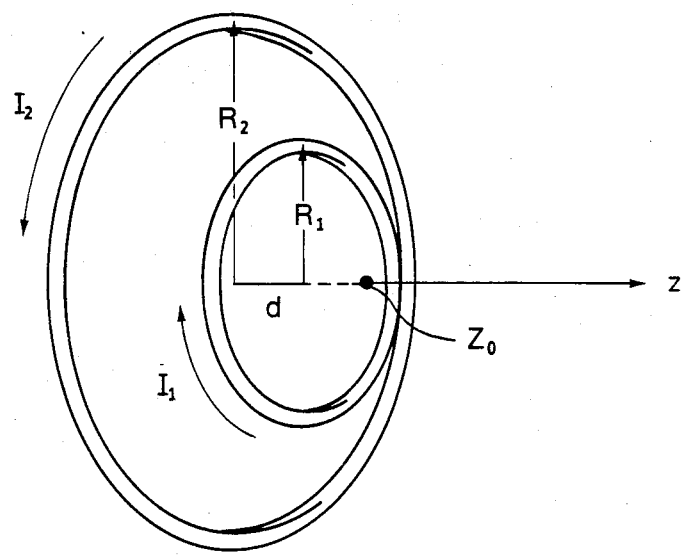
FIG. 1 is an illustration of a pair of electromagnet coils together with the various dimensions and variables used in the description below.

The magnet of the present invention is termed an "inside out Helmholtz" (IOH) magnet because it is based on principles which are similar to the principles of operation of a device known as a Helmholtz magnet. In a Helmholtz magnet there are two equal-sized, circular electromagnet coils which are coaxial and parallel to one another and which are spaced from one another by a distance equal to the radius of the coils. Electrical currents are applied to the two coils in the same direction. The Helmholtz magnet results in a region of highly uniform magnetic field intensity, which region is centered on a point that is midway between and centered on the axis of the two coils.

The principle of operation of the present invention can be understood with reference to an analysis of the magnetic fields produced by a simple coil. For a coil of radius R and consisting of N turns of wire, and with each turn carrying a current I, the magnetic field intensity B at a point on the cylindrical axis of the coil and at a distance z from the coil is known to be given by the equation:

$$B = \frac{\mu N I R^2}{2(R^2 + z^2)^{3/2}} \quad (1)$$

where $\mu$ is a constant.

The first derivative of B with respect to z is given by:

$$\frac{dB}{dz} = \frac{-3\mu N I R^2}{2} \cdot \frac{3z}{(R^2 + z^2)^{5/2}} \quad (2)$$

The second derivative of B with respect to z is given by:

$$\frac{d^2B}{dz^2} = \frac{-3\mu I R^2}{2(R^2 + z^2)^{5/2}} \left(1 - \frac{5z^2}{R^2 + z^2}\right) \quad (3)$$

It will be noted upon examination of equation (3) above that the second derivative is negative for $z=0$ to $z=R/2$, and is positive at greater values of z. The physical significance of this is that, at the point on the z axis where $z=R/2$, the magnetic field varies linearly with distance from the magnet. This point, at which $z=R/2$, is denoted $z_o$ in the following discussion and in FIG. 1.

The above observation, namely that a coil produces a magnetic field which decreases linearly at a distance of one half the radius of the coil (at $z_o$), is true for any circular coil. The present invention is based upon the further conclusion that it is possible to position a second, smaller coil coaxially with a first coil, and to select the radius and current of the small coil so that it produces a magnetic field which, at the $z_o=R/2$ point, increases in a linear manner at a rate which is identical to the rate at which the field from the larger coil decreases. By positioning the two coils so that their respective $z_o=R/2$ points coincide at the same point, the sum of the two fields is a field which, at the common $z_oR/2$ point, is constant with respect to z (i.e., its first derivative with respect to z is 0) and which also has a second derivative equal to zero. Thus there is obtained a region, centered at the common $z_o=R/2$ point, of substantially uniform magnetic field strength, and which is unilateral to, i.e. to one side of, the apparatus generating the field.

Provided the coils are located so that their $z_o=R/2$ points are coincident, and provided the two coils are of unequal sizes, it is possible to obtain the effects described above by appropriate selection of the counter-flowing currents in the two coils. More particularly, it is the mathematical product of the current I and the number of turns N of each coil which must be selected. The optimum effect is obtained when the condition $N_1 I_1 / R_1^2$ exists, where $N_1$ and $N_2$ are the number of turns in the small and large coils respectively, and $I_1$ and $I_2$ are the currents in the small and large coils respectively. When this condition exists, and so long as the coils are not equal in size, the magnetic fields from the two coils are not equal at $z_o$, so there is a net field, yet the first derivatives of the two fields with respect to z are equal and of opposite sign, and the second derivatives of each field with respect to z are each equal to zero.

When all these conditions are met, the net field at $z_o$ is given by the equation:

$$B(z_o) = B_z(z_o)(1 - (R_1 R_2)),$$

where $B_z(z_o)$ is the field strength at $z_o$ from the lareg coil alone. Thus the net field at $z_o$ is the field from the large coil multiplied by the fractional difference in the two coil radii. If the two coils are not very different in size, the net field will be very small, whereas if the two coils are very different the net field approaches a maximum which is equal to the field from the large coil.

Consider, for example, a large coil and a smaller coil, with the smaller coil being exactly half the diameter of the large coil, as illustrated in FIG. 1. The two coils are positioned coaxially and are spaced apart by the distance $d=(R_2-R_1)/2$, such that their $z_o=R/2$ points coincide at the point labeled $z_o$ in FIG. 1. Consider further that the product NI for the large coil is exactly four times the product NI for the small coil, for example, by using the same current in each turn of wire in each coil, but with the larger coil having four times as many turns. From the above equations, it can be readily shown that at $z=z_o$ the magnetic field from the large coil is exactly twice the strength of the field from the small coil, so that the net result at $z_o$ is a net field with exactly half the intensity of the field from the large coil alone. It can also be shown that at $z_o$ the fields from the two coils vary linearly with z at exactly the same rates, but in the opposite direction, so that at $z_o$ both the first and second derivatives of the net field with respect to z are zero.

Figure 2:
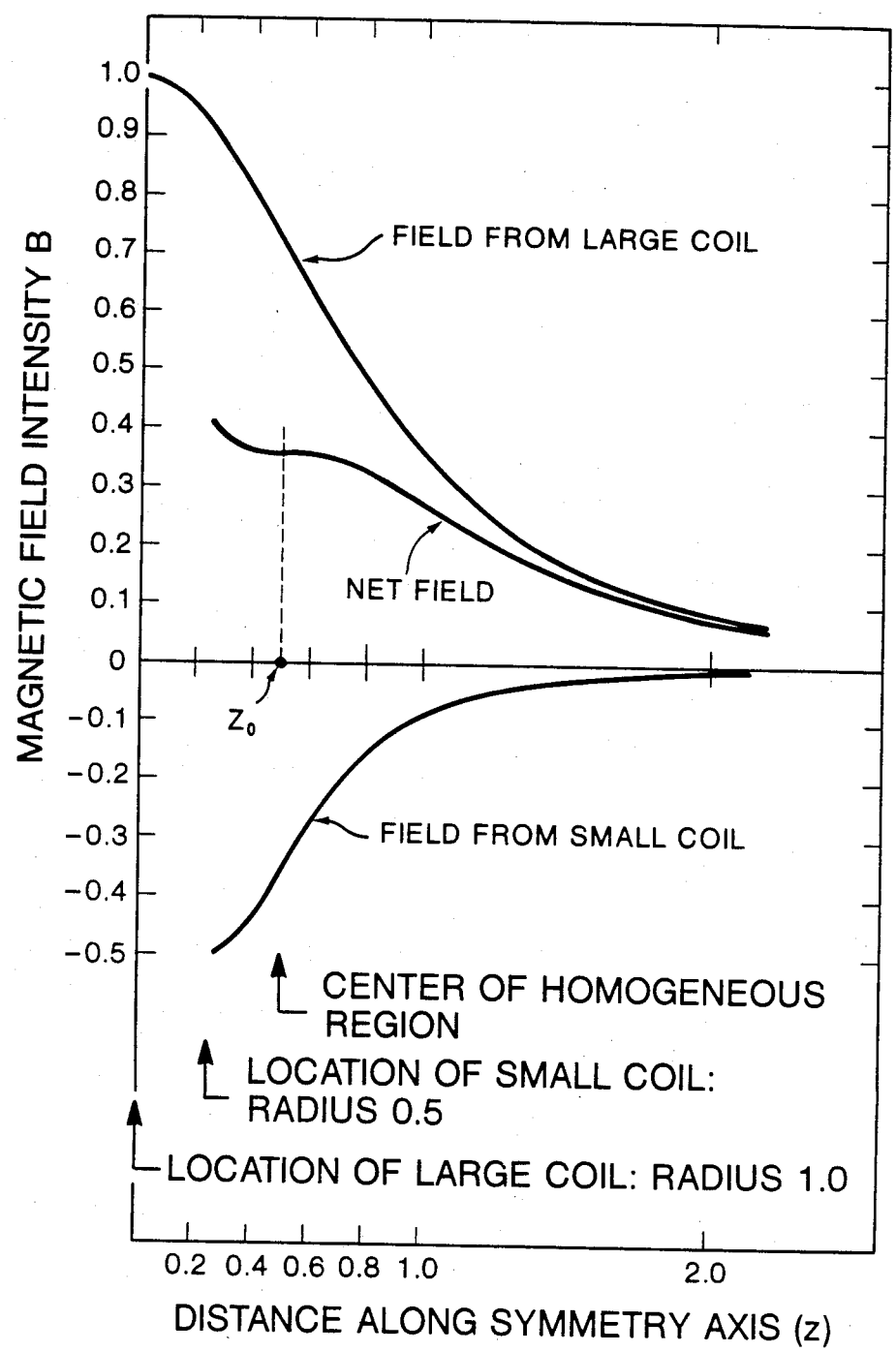
FIG. 2 is a graphical presentation of the magnetic fields produced by a pair of coils such as shown in FIG. 1, together with the net field formed by the combination of the fields.

FIG. 2 illustrates the variation along the z-axis of the field intensities from the coils shown in FIG. 1. Also shown is the net field resulting from the addition of the two fields.

Figure 3:
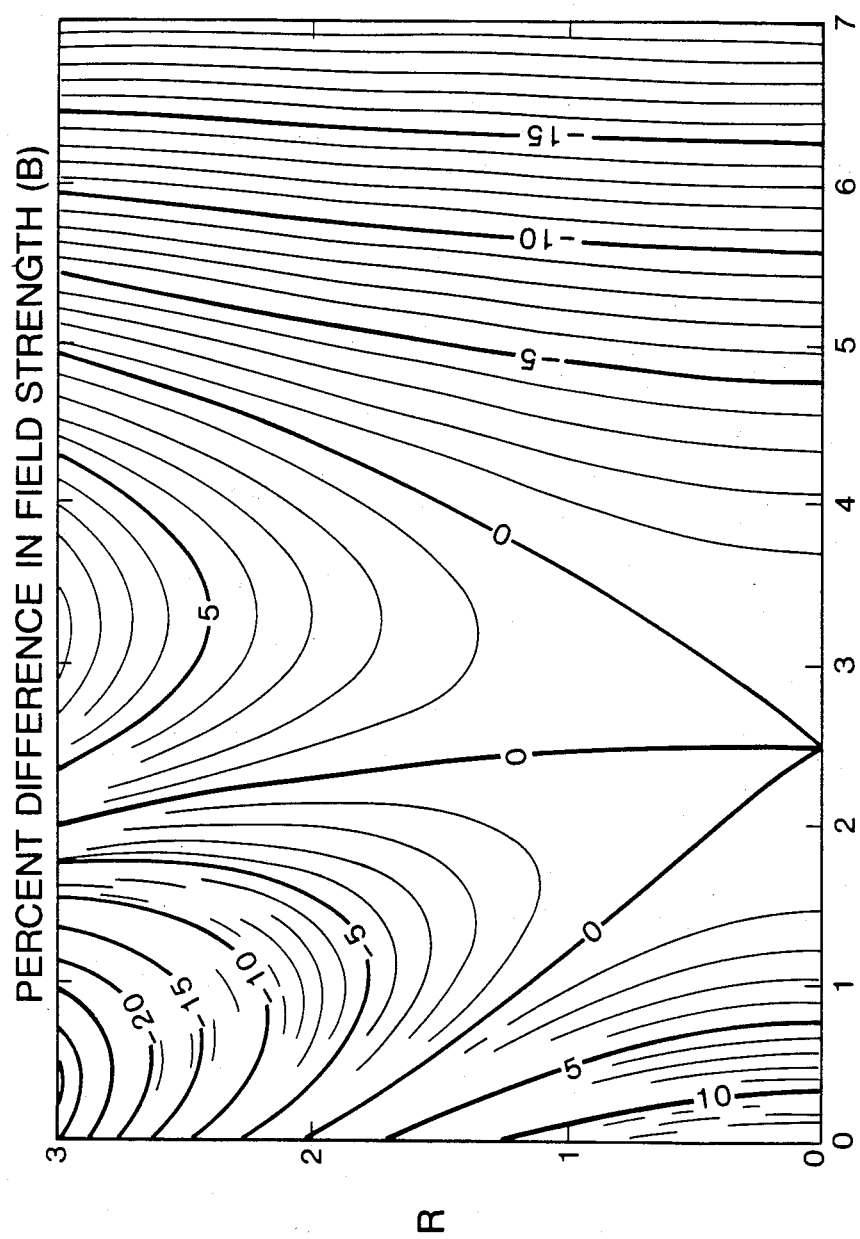
FIG. 3 is a graphical presentation of the variation in field strength along as well as away from the central axis (the z-axis) of the coils.

The result of a computer calculation of the field intensity near the region of homogeneity is shown in FIG. 3. For this set of coils, the large radius is taken to be 10 and the smaller radius to be 5 so the center of field uniformity is at $z=2.5$. The field along the cylindrically symmetric axis as discussed above can be seen along the line at $R=0$.

The field is more complex away from the symmetry axis but the uniform field region can be described in terms of the largest sphere which can be inscribed within the region of a given homogeneity. Thus, for this example, the $\pm 1\%$ sphere would be centered at $z=2.5$, $R=0$, and has a radius of about 1.

For an ideal magnet, that is, one having an infinitely small cross section, it can be demonstrated by theoretical calculations that the region in which the magnetic field intensity is constant to within 1% of the average field intensity is approximately 50% of the radius of the small loop; and the region in which the field is uniform to within one part in $10^5$ is about 10% of the radius.

A suitable embodiment of the system illustrated in FIG. 1 may consist of a first, smaller superconducting coil 88 cm in diameter and consisting of 1,839 turns of niobium-titanium wire, with a square cross section 2.8 cm on a side. A pair of such coils arranged in a conventional Helmholtz configuration has been demonstrated to produce a magnetic field of 0.3 Tesla (T) with an inhomogeneity of $6 \times 10^{-5}$ over a 9 cm diameter sphere, when used with a current density of $1.88 \times 10^4$ A/cm$^2$. The larger coil would have a diameter twice as large, i.e., 176 cm, and would consist of four times as many turns of the same niobium-titanium wire. Applying the same current to this coil results in the same current density as above, resulting in a total magnetic field of 0.15 T at a distance of 22 cm from the smaller coil. This magnet would have a field of 0.15 T, to within 1%, over a region that is centered on the axis of the magnet at a point 22 cm from the smaller loop and which extends 22 cm across. The same field is uniform to within one part in $10^5$ over a region that is centered on the same point but which is only 5 cm across.

Figure 4:
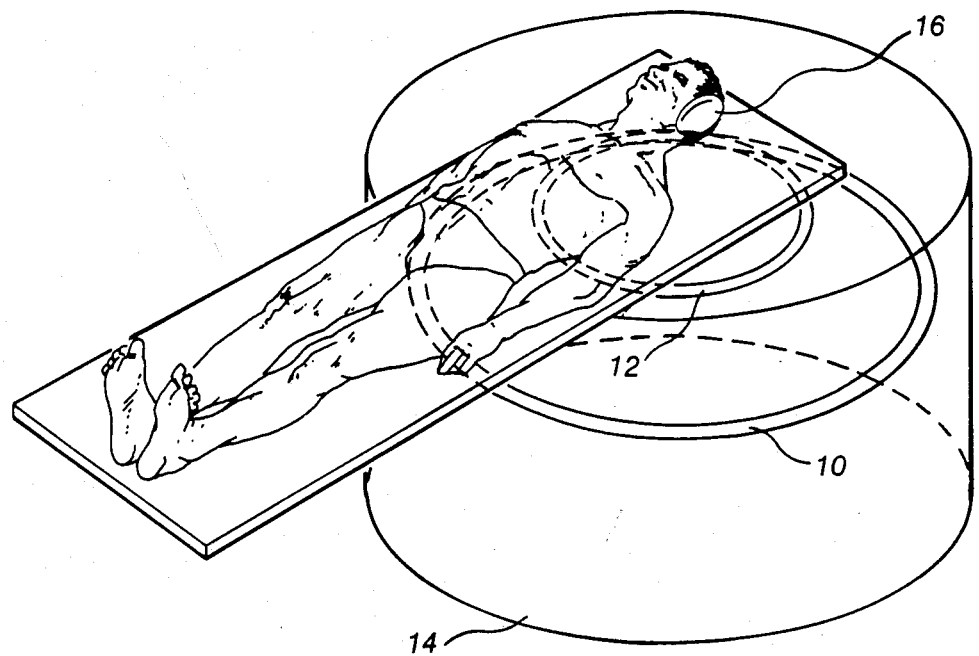
FIG. 4 is a pictorial illustration of how the present invention might be implemented in a medical NMR diagnostic facility.

FIG. 4 illustrates an NMR system constructed in accordance with the present invention for use as a medical diagnostic facility. The system includes a large electromagnet coil 10 and a small coil 12. The coils 10 and 12 lie horizontally and are contained in a suitable Dewar container 14 whereby the coils may be maintained at a superconducting temperature.

The small coil 12 is positioned above the large coil by the distance $(R_2 - R_1)/2$, where $R_2$ and $R_1$ are the radii of the large and small coils, respectively, as discussed above. A patient is positioned above the coils on a suitable table 15. The patient is positioned and oriented such that the region of the patient's body that is to be studied is centered on the $z_o$ point discussed above. More specifically, the region to be studied is centered on the common axis of the two coils and is located above the small coil by a distance which is equal to one-half the radius of the small coil. In the illustration, the patient's head is centered on the $z_o$ point.

Various types of NMR detectors may be used in combination with the magnet system of the present invention. In FIG. 4 there is illustrated a surface coil detector 16 positioned against the side of the patient's head. Surface coils are simple circular coils which provide limited directional and regional selectivity to NMR signals. As illustrated in FIG. 4, the surface coil 16 is oriented to detect NMR signals originating along the axis of the surface coil, or inside the head of the patient.

Figure 5:
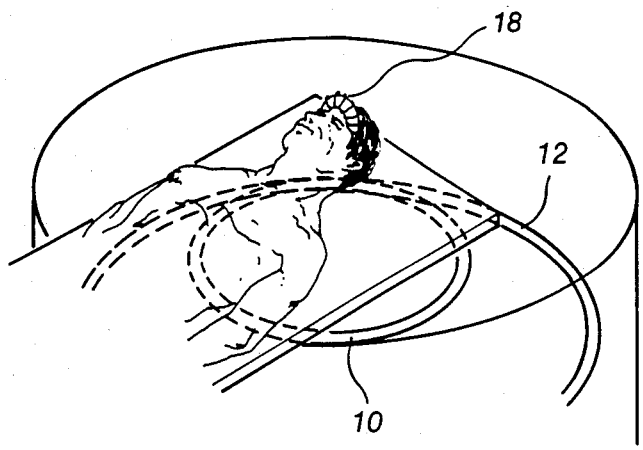
FIG. 5 illustrates the magnet arrangement of FIG. 4, however, with a semitoroidal coil being used as the detector coil.

Another type of detector which is contemplated for use with the present invention is a semitoroidal detector coil such as is disclosed and claimed in the U.S. patent application Ser. No. 479,581, filed Mar. 28, 1983. Such a semitoroidal coil 18 is illustrated in FIG. 5. A semitoroidal coil has somewhat greater regional selectivity than a surface coil and is thus more suited to topical NMR studies wherein it is desired to selectively detect NMR signals from a specific location in the patient's body.

Figure 6:
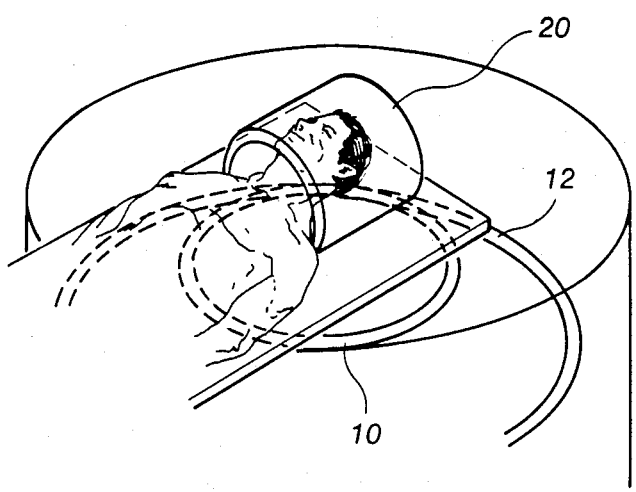
FIG. 6 illustrates the magnet arrangement of FIG. 4, with a solenoidal coil being used as the NMR detector coil.

Referring to FIG. 6, yet another type of detector that may be used in combination with the magnet of the present invention is a cylindrical solenoidal coil 20 which encases the patient or a portion of the patient's body that is to be studied. Such a coil would provide the greatest sensitivity over a larger region. However, in the case of a full body coil it has the disadvantage mentioned above of requiring that the patient be inserted in the coil. Because of its greater sensitivity, however, the solenoidal coil may be of greatest practical application where it is desired to obtain a simple and fast NMR analysis of a regional portion of a patient's body. For example, a patient's head may be inserted in the solenoidal detector coil 20, as illustrated in FIG. 6. The advantage of this arrangement is that it is simple, fast and yet provides high sensitivity.

In another application of the invention, a pair of large and small magnet coils may be oriented vertically behind a glovebox of the type used to handle radioactive or toxic materials. The coils are arranged in the manner of the invention discussed above so as to provide a region of homogeneous magnetic field inside the glovebox. A semitoroidal detector coil, or other suitable detector, may be located inside the glovebox, where it may be positioned against a sample to be analyzed. For example, the sample could be a radioactive or toxic material that is to be analyzed for water content or other chemical characteristics. Thus, NMR determinations may be made without removing the sample from the glovebox.

The foregoing description of certain preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Apparatus for generating within a selected volume a magnetic field having a uniform strength to a selected tolerance, comprising:
   a first electromagnet coil having a first number of turns $N_1$ at a first radius $R_1$ with a center of said first coil spaced axially a first distance from said selected volume;
   a second electromagnet coil axially concentric with and parallel to said first coil and having a second number of turns $N_2$ at a second radius $R_2$ greater than $R_1$ and spaced unilateral of said volume with said first coil a second distance greater than said first distance from said selected volume;
   said first radius and first distance and said second radius and second distance being functionally related to enable said first and second electromagnet coils to produce first and second magnetic fields, respectively, having substantially linear gradients within said selected volume;
   $N_1$ and $N_2$ being effective when energized with predetermined first and second currents, respectively, to produce equal and opposite gradients of said respective first and second magnetic fields in said unilateral volume and a net magnetic field having a strength within said selected volume effective for nuclear magnetic resonance determinations.

2. Apparatus according to claim 1, wherein said first and second coils are axially spaced apart a distance "d" substantially equal to the quantity $(R_2 - R_1)/2$.

3. Apparatus according to claim 1, wherein said first coil has a number of turns $N_1$ and a current $I_1$ related to a number of turns $N_2$ and a current $I_2$ of said second coil effective to obtain $N_1 I_1 / R_1^2 = N_2 I_2 / R_2^2$, where $I_1$ and $I_2$ have different senses.

4. Apparatus according to claim 1, wherein said selected volume is axially spaced from said first coil a distance $z_o = R_1/2$.

5. An NMR spectrometer, comprising:
   an electromagnet for generating a substantially uniform magnetic field in a selected volume unilaterally of said electromagnet, said electromagnet including
   a firt electromagnet coil having a first number of turns $N_1$ at a first radius $R_1$ with a center of said first coil spaced axially a first distance from said selected volume;
   a second electromagnet coil axially concentric with and parallel to said first coil and having a second number of turns $N_2$ at a second radius $R_2$ greater than $R_1$ and spaced unilateral of said volume with said first coil a second distance greater than said first distance from said selected volume;
   said first radius and first distance and said second radius and second distance being functionally related to enable said first and second electromagnet coil to produce first and second magnetic fields, respectively, having substantially linear gradients within said selected volume;
   $N_1$ and $N_2$ being effective when energized with predetermined first and second currents, respectively, to produce equal and opposite gradients of said respective first and second magnetic fields in said unilateral volume and a net magnetic field having a strength within said selected volume effective for nuclear magnetic resonance determinations; and
   NMR detector means operable to receive NMR signals emitted from a sample positioned in said selected volume of substantially uniform magnetic field.

6. The NMR spectrometer according to claim 5, wherein said first and second coils are axially spaced apart a distance "d" substantially equal to the quantity $(R_2 - R_1)/2$.

7. The NMR spectrometer according to claim 5, wherein said first coil has a number of turns $N_1$ and a current $I_1$ related to a number of turns $N_2$ and a current $I_2$ of said second coil effective to obtain $N_1 I_1/R_1^2 = -N_2 I_2/R_2^2$, where $I_1$ and $I_2$ have different senses.

8. The NMR spectrometer according to claim 5, wherein said selected volume is axially spaced about said first coil a distance $z_o = R_1/2$.

9. The NMR spectrometer according to claim 5, wherein said NMR detector means comprises a semitoroidal detector coil.

10. The NMR spectrometer according to claim 5, wherein said NMR detector means comprises a pancake coil oriented with its axis extending substantially perpendicular to the axis of said first and second electromagnet coils.

11. The NMR spectrometer according to claim 5, wherein said NMR detector means comprises a cylindrical solenoidal detector coil oriented with its axis extending substantially perpendicular to the axis of said first and second electromagnet coils.

* * * * *